(12) United States Patent
Okubora et al.

(10) Patent No.: US 6,714,422 B2
(45) Date of Patent: Mar. 30, 2004

(54) HIGH FREQUENCY MODULE DEVICE AND METHOD FOR ITS PREPARATION

(75) Inventors: Akihiko Okubora, Kanagawa (JP); Tsuyoshi Ogawa, Kanagawa (JP); Hirokazu Nakayama, Kanagawa (JP); Yoichi Oya, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/951,148

(22) Filed: Sep. 13, 2001

(65) Prior Publication Data

US 2002/0075106 A1 Jun. 20, 2002

(30) Foreign Application Priority Data

Sep. 14, 2000 (JP) ........................................ 2000-280632

(51) Int. Cl.[7] .............................. H05K 1/11; H05K 1/14
(52) U.S. Cl. ...................................... 361/793; 361/795
(58) Field of Search ................................ 361/760–766, 361/793–795, 816, 818; 174/35 R, 35 MS, 255–260; 257/635, 728, 665–668, 723, 724; 428/209

(56) References Cited

U.S. PATENT DOCUMENTS

| | | | | |
|---|---|---|---|---|
| 4,692,839 A | * | 9/1987 | Lee et al. ............... | 361/386 |
| 5,373,112 A | * | 12/1994 | Kamimura et al. ......... | 174/255 |
| 5,375,042 A | * | 12/1994 | Arima et al. .............. | 361/784 |
| 5,488,542 A | * | 1/1996 | Ito ............................ | 361/793 |
| 5,639,989 A | * | 6/1997 | Higgins, III ........... | 174/35 MS |
| 5,929,510 A | * | 7/1999 | Geller et al. ............. | 257/635 |
| 6,057,600 A | * | 5/2000 | Kitazawa et al. ......... | 257/728 |
| 6,214,445 B1 | * | 4/2001 | Kanbe et al. ............. | 428/209 |
| 6,254,971 B1 | * | 7/2001 | Katayose et al. ......... | 428/209 |
| 6,339,197 B1 | * | 1/2002 | Fushie et al. ............. | 174/262 |

* cited by examiner

Primary Examiner—David E. Graybill
Assistant Examiner—Tuan Dinh
(74) Attorney, Agent, or Firm—Frommer Lawrence & Haug LLP; William S. Frommer; Dennis M. Smid

(57) ABSTRACT

A high frequency module device of a thin type, high precision and high functions in which the size and the cost of the package may be diminished. The module device includes a base substrate (2) and a high frequency device layer (4). The base substrate (2) is formed by forming a patterned wiring layer (9) on a first major surface (5a) of a core substrate (5) molded of an organic material exhibiting thermal resistance and high frequency characteristics. The uppermost layer of the base substrate (2) is planarized to form a high frequency device layer forming surface (3). The high frequency device layer portion (4) is formed on the high frequency device layer forming surface (3) by a thin film or thick film forming technique and includes intra-layer passive elements, made up of a resistor (27) and a capacitor (26). The passive elements are supplied with power or signals from the side base substrate.

9 Claims, 18 Drawing Sheets

HIGH FREQUENCY MODULE DEVICE AND METHOD FOR ITS PREPARATION

BACKGROUND OF THE INVENTION

1. Field of the Invention

This invention relates to a high frequency module device and a method for producing the device. More particularly, it relates to a high frequency module device loaded in a variety of electronic equipment, such as personal computers, a portable telephone set or audio equipment to form an ultra-small-sized communication function module having e.g., an information communication function or an information storage function.

2. Description of Related Art

The information of various sorts, such as music, speech or pictures, has come to be handled readily by a personal computer or a mobile computer in recent years with the advent of data digitizing technique. Moreover, the above information may be compressed in bands by speech codec or picture codec techniques and has come to be distributed readily and efficiently to a variety of communication terminal equipment by digital communication or digital broadcast. For example, the audio video data (AV data) can be received outdoors by portable telephone sets.

Meanwhile, as a network system convenient for a small territory, including homes, has now been proposed, variable utilization of transmission/reception systems for e.g., data has become possible. As such network system, a variety of next-generation wireless systems, such as a narrow band radio communication system of the 5 GHz band, as proposed in IEEE 802.1a, radio LAN system of 2.45 band, as proposed in IEEE 802.1b, or the short range radio communication system, termed Bluetooth, are stirring up notice. In a transmission/reception system for e.g., data, such wireless network systems are effectively utilized to exchange a variety of data, to access the Internet or to transmit/receive data in households or outdoors in a handy manner without using e.g., relaying devices.

Meanwhile, in a communication terminal equipment, it is necessary to modulate/demodulate analog high frequency signals in the transmission/reception unit. So, a high frequency transmission/reception circuit 100 of a superheterodyne system, in which the transmission/reception signals are first converted into signals of an intermediate frequency, as shown in FIG. 1, is routinely used.

A high frequency transmission/reception circuit 100 includes an antenna unit 101 provided with an antenna or with a changeover switch for transmitting or receiving information signals, and a transmission/reception switching unit 102 for switching between transmission and reception. The high frequency transmission/reception circuit 100 also includes a receipt circuit unit 105 made up e.g., of a frequency conversion circuit unit 103 or with a demodulation circuit unit 104. The high frequency transmission/reception circuit 100 also includes a transmission circuit unit 109 made up e.g., of a power amplifier 106, a driving amplifier 107 and a modulation circuit unit 108. The high frequency transmission/reception circuit 100 also includes a reference frequency generating circuit for supplying a reference frequency to the receipt circuit unit 105 or to the transmission circuit unit 109.

The high frequency transmission/reception circuit 100 has an extremely large number of component parts, such as large-sized functional components, interposed between respective stages, such as a variety of filters, local oscillators (VCO) or SAW filters, or passive components, such as inductors, resistors or capacitors, proper to the high frequency analog circuits, such as matching circuits or bias circuits. With the high frequency transmission/reception circuit 100, each circuit part is designed as an IC, however, the filter interposed between the respective stages cannot be built into the IC. Moreover, a matching circuit is necessary to provide as an exterior type circuit. Thus, the high frequency transmission/reception circuit 100 is generally bulky in size to present obstacles in reducing the size and weight of the communication terminal equipment.

On the other hand, a high frequency transmission/reception circuit 110 of the direct conversion system, designed to transmit/receive information signals without conversion into an intermediate frequency, as shown in FIG. 2, is also used in the communication terminal equipment. In this high frequency transmission/reception circuit 110, information signals, generated in a source, are directly modulated in a modulation circuit unit 114 to the preset frequency range, without conversion to the intermediate frequency, and transmitted over an antenna 111 through an amplifier 115 and a transmission/reception switching unit 112.

In such high frequency transmission/reception circuit 110, in which the information signals are transmitted/received by direct detection without conversion of the intermediate frequency of the information signals, the number of component parts, such as filters, is reduced to simplify the overall structure so that expectation may be made of a structure closer to a one-chip structure. However, in the high frequency transmission/reception circuit 110, the filters or matching circuits, arranged on the downstream side, need to be coped with. Moreover, with the high frequency transmission/reception circuit 110, in which the information signals are amplified once and for all in the high frequency stage, it becomes difficult to realize a sufficient gain such that it is necessary to perform amplification in the baseband portion. Thus, the high frequency transmission/reception circuit 110 is in need of a DC offset cancelling circuit or a redundant low-pass filter, while the overall power consumption is increased.

In the conventional high frequency transmission/reception circuit, requirements for reduction in size or weight of the communication terminal equipment cannot be met satisfactorily for the superheterodyne system or the direct conversion system. For this reason, a variety of attempts have been made in designing the high frequency transmission/reception circuit as a small-sized module by a simplified structure based on e.g., a Si-CMOS circuit. That is, one of the attempts is to form an active device of high properties on an Si substrate and to build filter circuits or resonators on an LSI as well as to form the logic LSI of the baseband portion as an integrated circuit to produce a so-called one-chip high frequency transmission/reception module.

However, in such high frequency transmission/reception module, how an inductor of high performance is to be formed on an LSI is crucial. In a high frequency transmission/reception circuit 120, a large-sized recess 124 is formed in register with an inductor forming site 123 of an Si substrate 121 and an $SiO_2$ insulating layer 122, as shown in FIG. 3. In the high frequency transmission/reception circuit 120, a first wiring layer 125 is formed facing the recess 124, while a second wiring layer 126 closing the recess 124 is formed to form an inductor 127. In another type of the high frequency transmission/reception module, the wiring pattern is segmented and raised from the substrate surface to float in air to form an inductor. However, in such high frequency transmission/reception module, the process of forming the inductor is extremely labor-consuming such that the production cost is raised due to the increased number of process steps.

On the other hand, in a one-chip high frequency transmission/reception module, electrical interference of an Si substrate interposed between the high frequency circuit portion of an analog circuit and a baseband circuit portion of a digital circuit poses a serious problem. As for the high frequency transmission/reception module, an Si substrate high frequency transmission/reception module 130 shown in FIG. 4 or a glass substrate high frequency transmission/reception module 140 shown in FIG. 5 has been proposed. In the high frequency transmission/reception module 130, an $SiO_2$ layer 132 is formed on an Si substrate, after which a passive elements forming layer 133 is formed by a lithographic technique.

In the passive elements forming layer 133, there are formed passive elements, such as inductors, resistors or capacitors to a multi-layer structure by a thin film forming technique or by a thick film forming technique, along with a wiring pattern, although details are not shown. In the high frequency transmission/reception module 130, a terminal unit connected to an internal wiring pattern is formed on the passive elements forming layer 133 through e.g., a via-hole (relaying through-hole) and a circuit device 134, such as a high frequency IC or LSI, is directly mounted on the passive elements forming layer 133 by e.g., a flip-chip mounting method.

The high frequency transmission/reception module 130 may be mounted on e.g., a motherboard to isolate the high frequency circuit portion and the baseband circuit portion from each other to suppress electrical interference therebetween. Meanwhile, in such high frequency transmission/reception module 130, there is presented a problem that the electrically conductive Si substrate 131, operating when forming each passive elements in the passive elements forming layer 133, is obstructive for optimum high frequency characteristics of the respective passive elements.

In a high frequency transmission/reception module 140, a glass substrate 141 is used as a base substrate to overcome the aforementioned problem concerning the Si substrate 131 of the frequency transmission/reception module 130. In the high frequency transmission/reception module 140, a passive elements forming layer 142 is similarly formed on the glass substrate 141 by the lithographic technique. In the passive elements forming layer 142, there are formed passive elements, such as inductors, resistors or capacitors by a thin film forming technique or by a thick film forming technique, to form a multi-layer structure, along with a wiring pattern, although not shown in detail. In the high frequency transmission/reception module 140, a terminal unit connected to an internal wiring pattern is formed on the passive elements forming layer 142, through e.g., a via-hole (relaying through-hole), and a circuit device 133, such as a high frequency IC or LSI, is directly mounted on the passive elements forming layer 133 by e.g., a flip-chip mounting method.

In the high frequency transmission/reception module 140, employing an electrically non-conductive glass substrate 141, the degree of capacitative coupling across the glass substrate 141 and the passive elements forming layer 142 can be suppressed to form a passive elements exhibiting superior high frequency characteristics within the passive elements forming layer 142. However, in mounting the high frequency transmission/reception module 140 on e.g., a motherboard, a terminal pattern is formed on a surface of the passive elements forming layer 142, as shown at 150, and the high frequency transmission/reception module 140 then is mounted, such as by wire bonding, to a mother board 151, after which it is connected to the motherboard. So, with the high frequency transmission/reception module 140, a terminal pattern forming step and a wire-bonding step are necessitated.

In the above-described high frequency transmission/reception module, a highly precise passive elements forming layer is formed on the base substrate, as described above. In forming the passive elements forming layer on the base substrate by a thin film forming technique, the base substrate is required to exhibit thermal resistance against rise in the surface temperature at the time of sputtering, retention of depth of focus at the time of lithography and contact alignment characteristics at the time of masking. So, the base substrate is required to exhibit high planarity, insulating properties, thermal resistance properties and resistance against chemicals.

The Si substrate 131 and the glass substrate 141 exhibit these properties to enable passive elements of low cost and low loss by a process different from the LSI process. Moreover, as compared to the pattern forming method by printing, as used in a conventional ceramic module technique or to the wet etching method used in forming a wiring pattern on a printed wiring board, the Si substrate 131 and the glass substrate 141 permit passive elements to be formed thereon to a high precision, while permitting the device size to be reduced to approximately one-hundredth of that achieved with the above-mentioned conventional methods. In addition, with the Si substrate 131 and the glass substrate 141, the marginal usable frequency band of the passive elements can be raised to 200 GHz by comminution.

However, in the above-described high frequency transmission/reception module, high frequency signal pattern formation, wiring to supply the power source or the grounding or the wiring of the control signals are made through a wiring layer formed on the Si substrate 131 or on the glass substrate 141. In the high frequency transmission/reception module, electrical interference is produced across respective wirings, while the problem of cost due to forming the wiring layer as a multi-layer wiring is also raised.

Moreover, the high frequency transmission/reception modules 130, 140 are packaged as shown in FIG. 6. On one major surface of an interposer substrate 151 of a package 150 is mounted a high frequency transmission/reception module 130, with the entire assembly being encapsulated in an insulating resin 156. On the front and reverse surfaces of the interposer substrate 151 are formed pattern wiring layers 152, 153, respectively. Around the loading area for the high frequency transmission/reception module 130 are formed numerous lands 154.

As the high frequency transmission/reception module 130 is loaded on the interposer substrate 151 of the package 150, this high frequency transmission/reception module 130 and the lands 154 are electrically connected together by wire bonding 155 to enable power supply or signal transmission/reception. So, there is formed, on a surface layer of the high frequency transmission/reception module 130, having mounted thereon a high frequency IC 134 or a chip component 135, a wiring pattern 136 interconnecting these mounted components and connection terminals 137 to the wire bonding 155. The high frequency transmission/reception module 140 is also packaged in a similar manner.

Since the high frequency transmission/reception modules 130, 140 are packaged through the interposer substrate 151 as described above, there are presented problems that the package 150 is increased in thickness or size, while the cost of the package is raised.

In the Si substrate or in the glass substrate high frequency transmission/reception module, a shield cover is provided for overlying the high frequency IC or circuit devices, such as LSIs. However, there is raised a problem that the module becomes bulky depending on the heat radiating structure for the heat generated from these circuit devices. In addition, the production cost tends to be raised due to use of the relatively expensive Si substrate 121 or glass substrate 131.

SUMMARY OF THE INVENTION

It is therefore an object of the present invention to provide a high frequency module device in which a high precision passive elements or a high density wiring layer is formed on a base substrate formed of inexpensive organic resin to improve the function, as well as to reduce the thickness and size and to lower the production cost. It is another object of the present invention to provide a method for the preparation of the a high frequency module device.

The high frequency module device according to the present invention includes a base substrate and a high frequency device layer deposited on this base substrate. The base substrate is made up of a core substrate formed of an organic material exhibiting thermal resistance and high frequency characteristics, and a patterned wiring layer formed on its first major surface. The uppermost layer is flattened out to form a high frequency device layer forming surface. The high frequency device layer, formed on the high frequency device layer forming surface of the base substrate by a thin film forming technique or a thick film forming technique, includes intra-layer passive elements, made up of a resistor, a capacitor or a patterned wiring, supplied with power or signals from the side base substrate through a dielectric insulating layer.

With the high free module device of the present invention, the high frequency device layer is directly formed, by the a thin film forming technique or by the thick film forming technique, on the high frequency device layer forming surface of the base substrate, exhibiting insulating properties and presenting a high precision flattened surface, so that passive elements or wiring layers of high precision and optimum high frequency characteristics may be formed within the bulk of the high frequency device layer. The overall cost of the high frequency device layer may be diminished because the base substrate is formed at a low cost on the core substrate of an inexpensive material in the same way as the conventional multi-layer substrate process. In the high frequency module device, in which the wiring for the power source or the grounding or the wiring of the control system is built in the base substrate and a high frequency signal circuit is formed in the high frequency device layer, electrical isolation may be achieved to suppress electrical interference to improve characteristics. With the high frequency module device, in which a power source of a sufficient area and the grounding wiring may be provided on the base substrate, power source supply with high regulation can be achieved.

The present invention also provides a method for the preparation of a high frequency module device comprised of a base substrate forming step and a high frequency device layer forming step. The base substrate forming step includes a first step of forming a core substrate from an organic material exhibiting thermal resistance and high frequency characteristics, a second step of forming a multi-layer wiring pattern layer on the first major surface of the core substrate and a third step of flattening out the uppermost layer to form a high frequency device layer forming surface. The high frequency device layer forming step includes a step of forming intra-layer passive elements by forming multiple layers comprised of a resistor, a capacitor or a wiring pattern supplied with power or signals from the side base substrate by a thin or thick film forming technique.

With the method for the preparation of the high frequency module device, according to the present invention, a high frequency device layer is directly formed by a thin or thick film forming technique on a high frequency device layer forming surface, designed as a high precision insulating planar surface, to provide a thin type high precision high frequency module device having high precision passive elements of optimum high frequency characteristics in the layers of the high frequency device layer. With the present method for the preparation of the high frequency module device, the wiring for the power source or the grounding or the wiring for the control system are provided on the base substrate, while a high frequency signal circuit is provided on the high frequency device layer, whereby the base substrate and the high frequency device layer are electrically separated from each other to suppress electrical interference to improve the characteristics of the high frequency module device. With the present method for the preparation of the high frequency module device, a high frequency module device may be produced in which the power source with a sufficient area for the base substrate and the grounding wiring may be formed in the base substrate to assure power supply with high regulation properties.

According to the present invention, the major surface of the core substrate formed of an insulating inexpensive organic material is flattened out to high precision to form a high frequency device layer forming surface, on which a high frequency device layer formed by a thin or thick film forming technique is directly formed to produce passive elements of high precision exhibiting superior high frequency characteristics by a simplified process. According to the present invention, in which the base substrate may be formed at a low cost by forming a multi-layer wiring layer on the core substrate of an inexpensive material by a process similar to the conventional multi-layer substrate process, a high frequency module device may be produced which is reduced in overall cost. With the present method for the preparation of the high frequency module device, the wiring for the power source or the grounding and the wiring for the control system are provided on the base substrate, while a high frequency signal circuit is provided on the high frequency device layer, whereby the base substrate and the high frequency device layer may be electrically isolated from each other to suppress electrical interference to improve the characteristics of the high frequency module device. According to the present invention, a high frequency module device may be produced in which the power source with a sufficient area for the base substrate and the grounding wiring may be formed in the base substrate to assure power supply with high regulation properties.

BRIEF DESCRIPTION OF THE DRAWINGS

FIG. 3A is a perspective view showing essential portions thereof and FIG. 3B is a longitudinal cross-sectional view showing essential portions thereof.

FIGS. 24A–24F illustrate another process of forming a base substrate.

DESCRIPTION OF THE PREFERRED EMBODIMENTS

Figure 1:
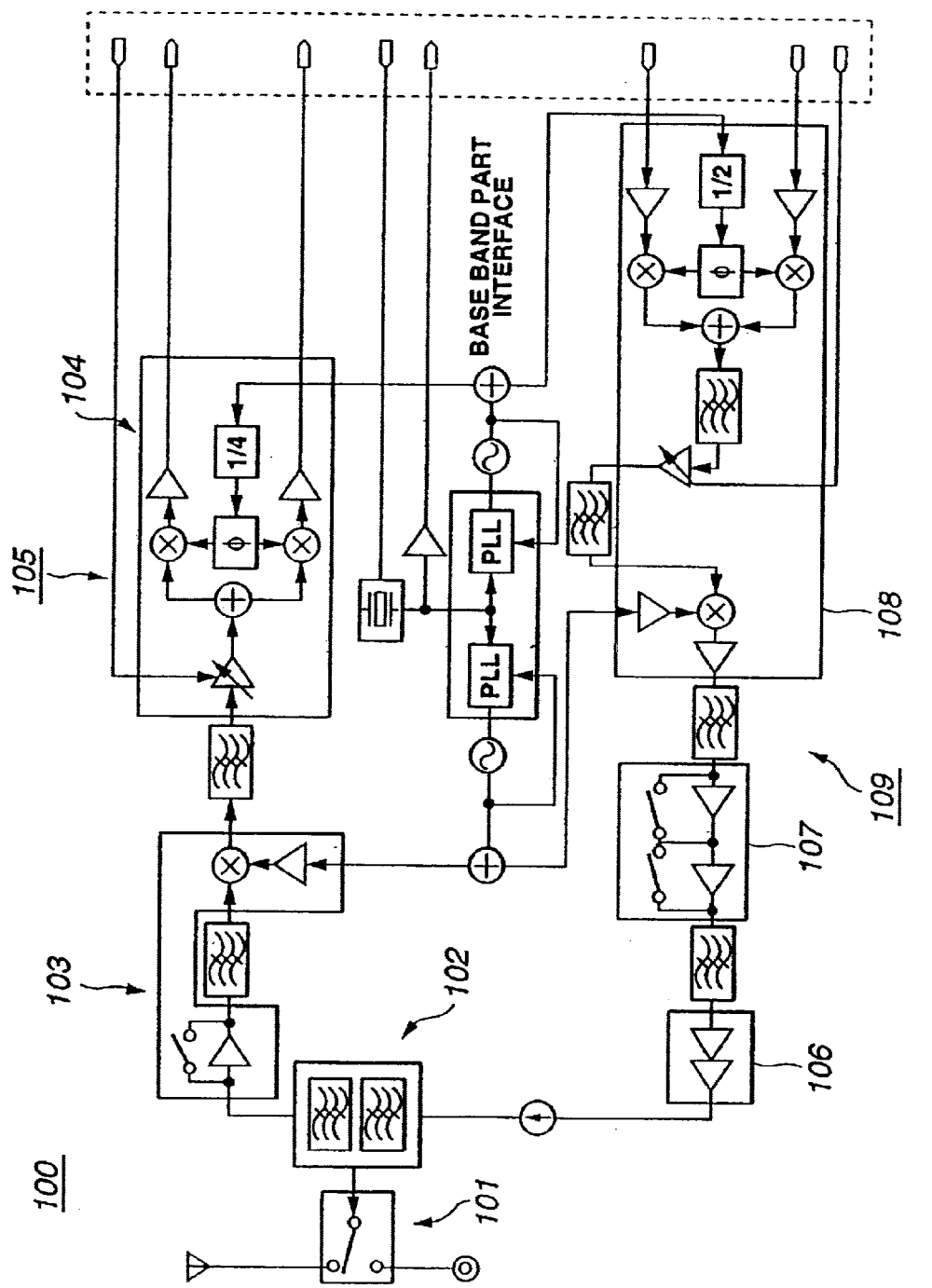
FIG. 1 is a structural view of a high frequency transmission/reception circuit by the superheterodyne system.
Figure 2:
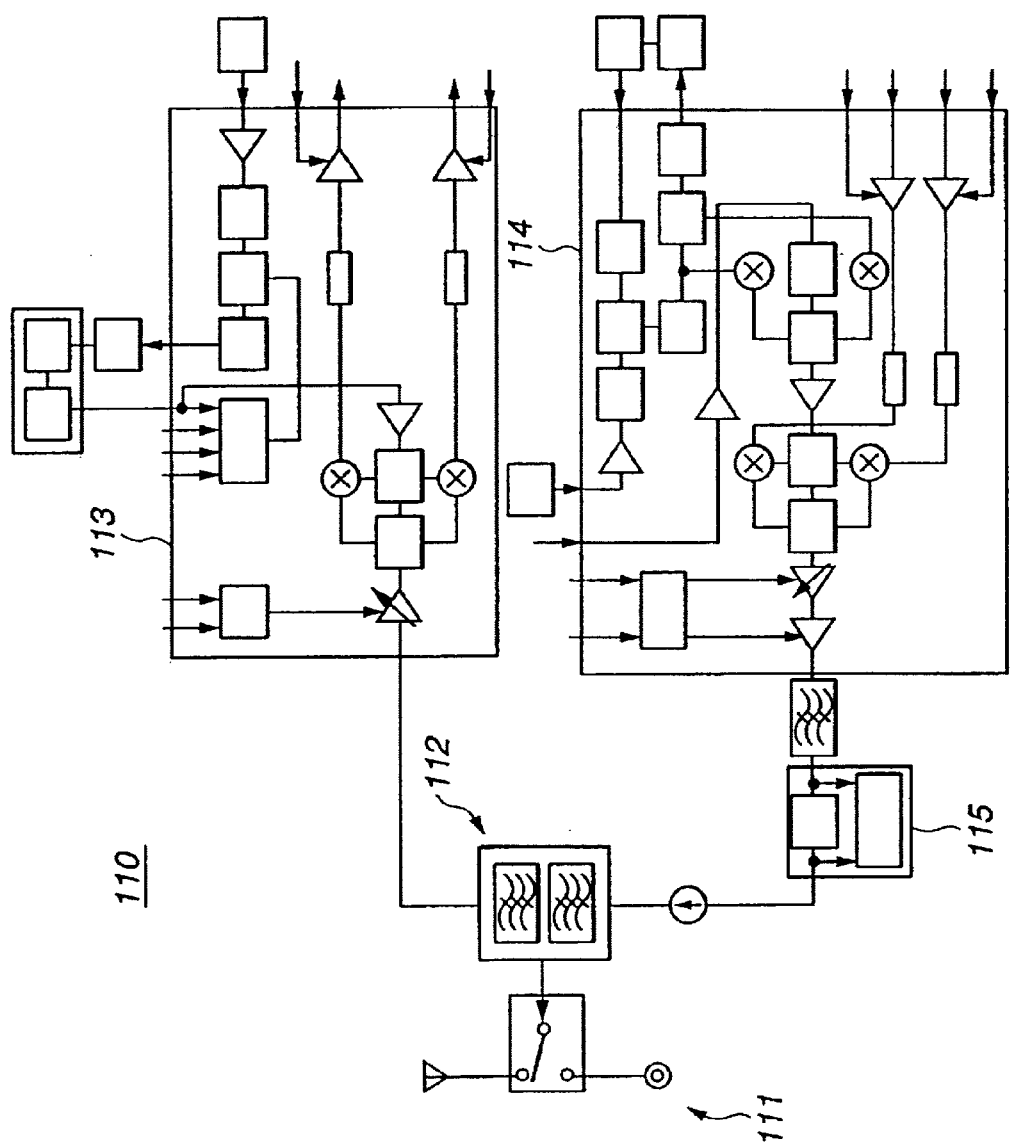
FIG. 2 is a structural view of a high frequency transmission/reception circuit by the direct conversion system.
Figure 3A:
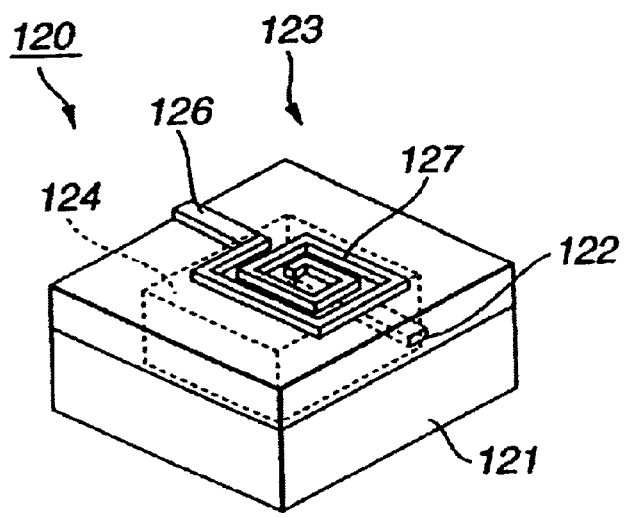
FIGS. 3A and 3B illustrate an inductor provided in a conventional high frequency transmission/reception module, where
Figure 3B:
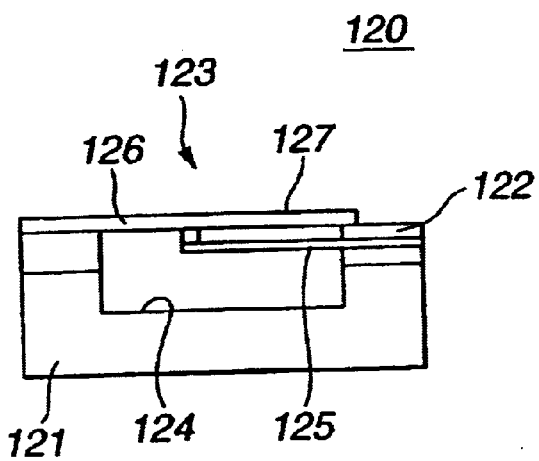
Figure 4:
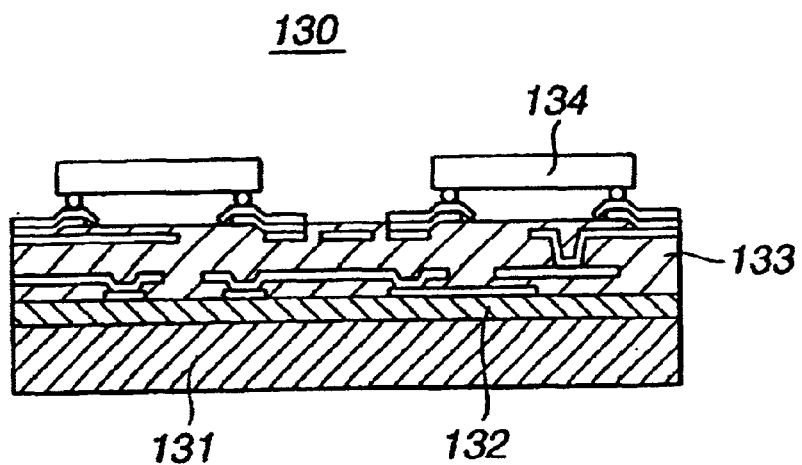
FIG. 4 is a longitudinal cross-sectional view showing a conventional high frequency transmission/reception module employing a silicon substrate.
Figure 5:
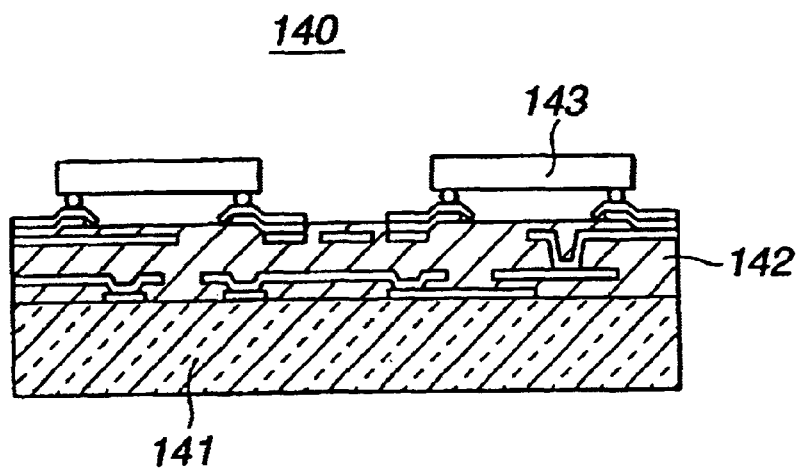
FIG. 5 is a longitudinal cross-sectional view showing a conventional high frequency transmission/reception module employing a glass substrate.
Figure 6:
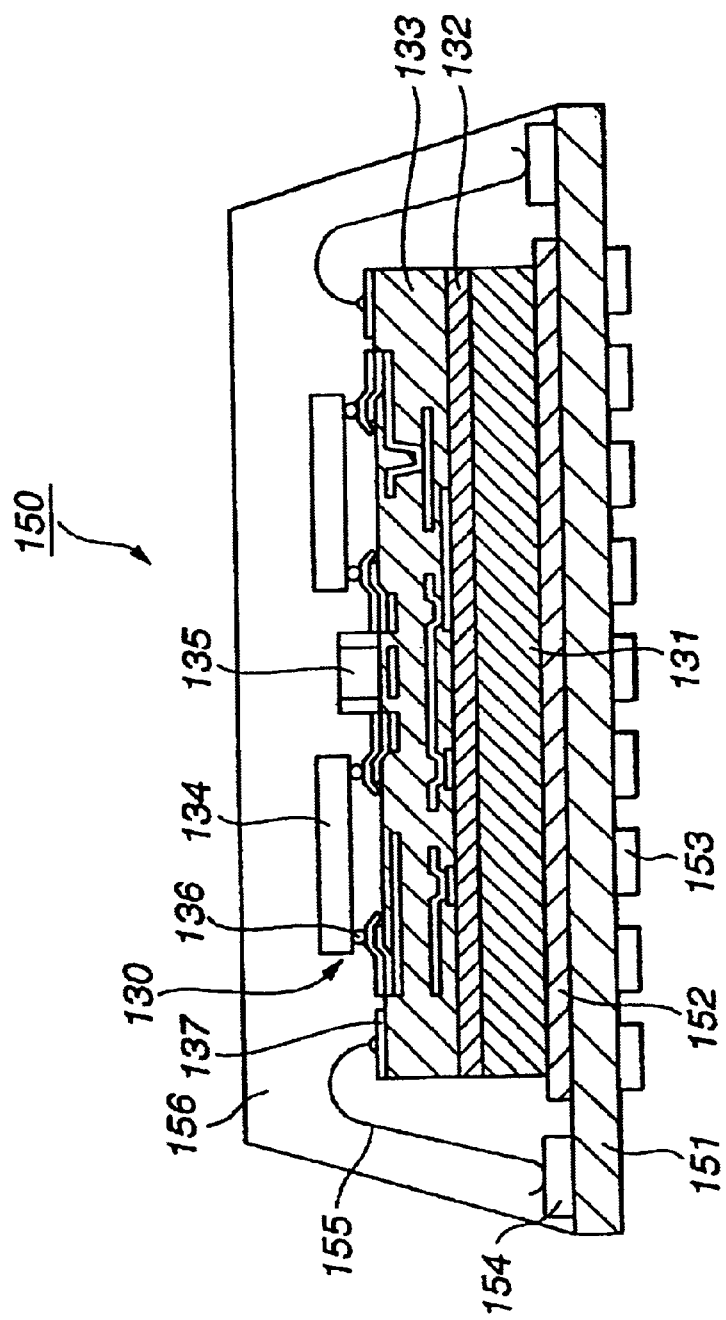
FIG. 6 is a longitudinal cross-sectional view showing a package obtained on mounting a conventional high frequency transmission/reception module on an interposer substrate.
Figure 7:
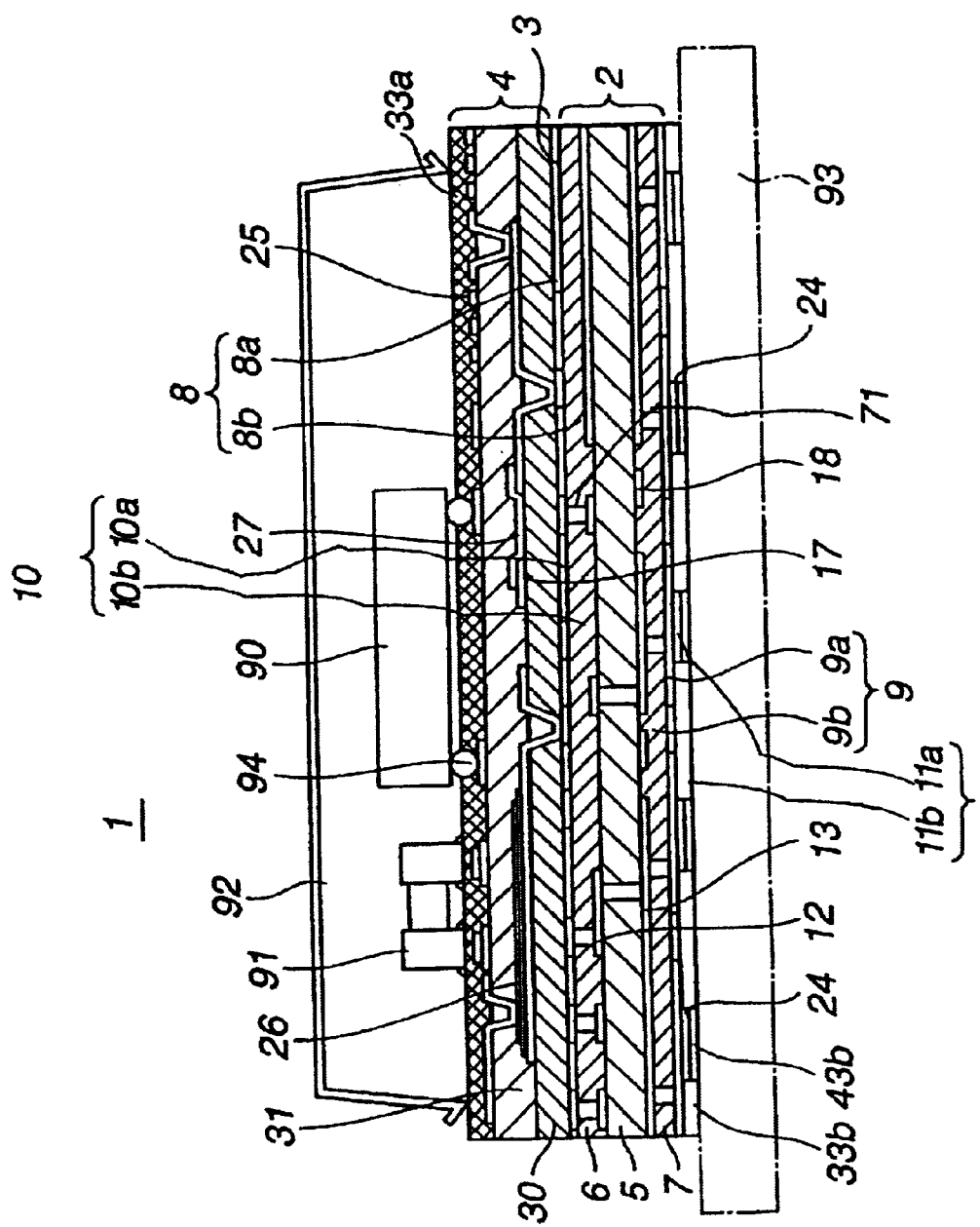
FIG. 7 is a longitudinal cross-sectional view showing high frequency transmission/reception module according to the present invention.

Referring to the drawings, preferred embodiments of the present invention will be explained in detail. In a high frequency module device 1, shown as an embodiment in FIG. 7, a base substrate 2, the uppermost layer of which is formed as a high frequency device layer forming surface 3 of high planarity, is prepared by a base substrate producing step which will be explained subsequently. Using this base substrate 2 as a base, a high frequency device layer portion 4 is formed on the high frequency device layer forming surface 3 by a high frequency device layer forming step which will also be explained subsequently. In the high frequency module device 1, the base substrate 2 forms a wiring portion of a power source system for the high frequency device layer portion 4 formed as an upper layer, while also forming a wiring portion for the control system or a ground surface. On the upper surface of the high frequency device layer portion 4 of the high frequency module device 1, a high frequency IC 90 or a chip component 91 is mounted on an upper surface of the high frequency device layer portion 4, and a shield cover 92 is applied for sealing, as shown in FIG. 7. The high frequency module device 1 is mounted as a so-called one-chip component on a motherboard 93.

The base substrate 2 is made up of a core substrate 5, comprised of a double-sided substrate, a first pattern wiring layer 6, formed on one major surface 5a of the core substrate 5, as a core, and a second pattern wiring layer 7, formed on the other major surface of the core substrate 5. On the core substrate 5 of the base substrate 2 are bonded first to fourth resin coated copper foils 8 to 11, as will be explained subsequently. The first resin-coated copper foil 8 is bonded to the first major surface 5a of the core substrate 5 to form the two-layered first pattern wiring layer 6 along with the core substrate 5. The second resin-coated copper foil 9 is bonded to the second major surface 5b of the core substrate 5 to form the two-layered second pattern wiring layer 7 along with the core substrate 5.

Figure 8:
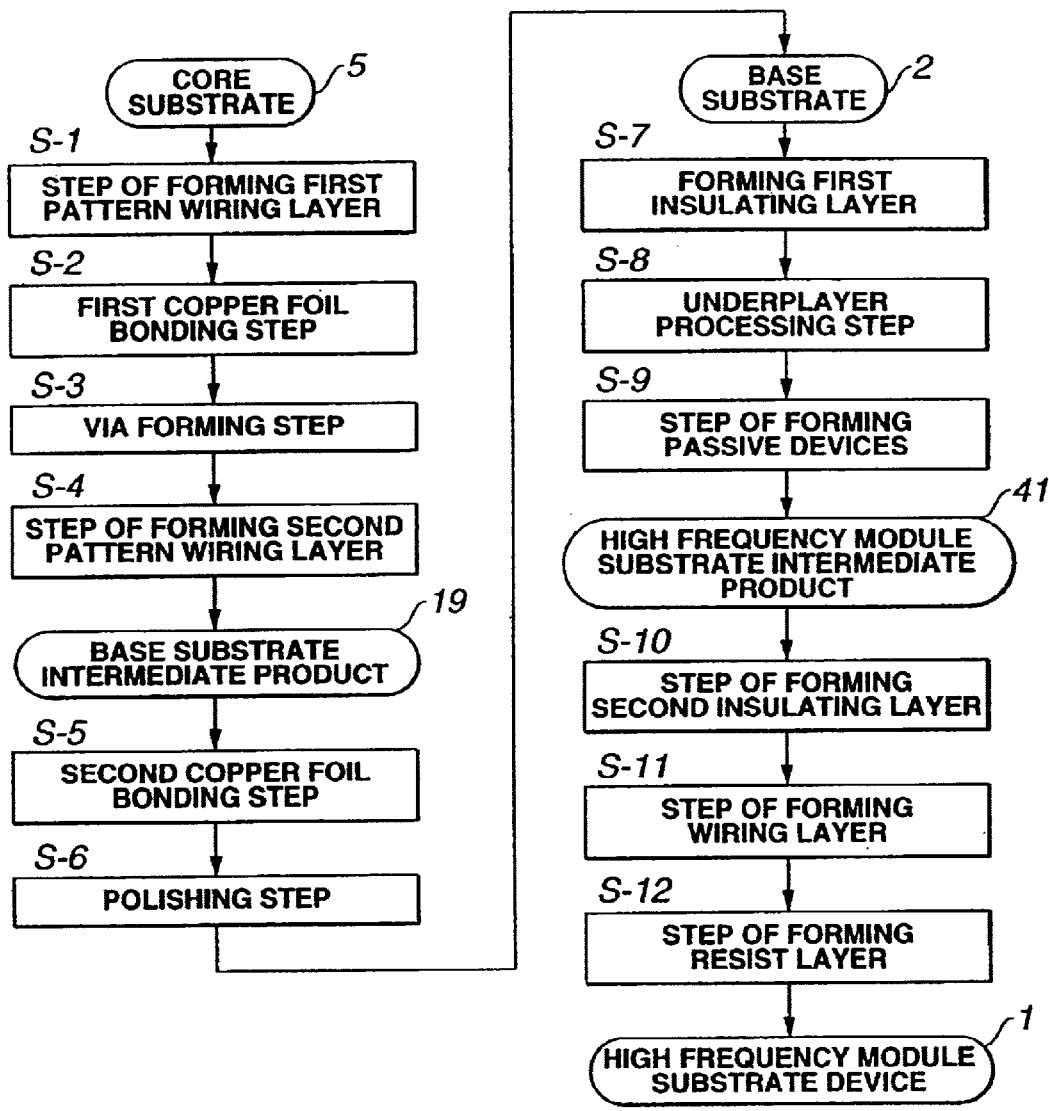
FIG. 8 illustrates the production process for the high frequency transmission/reception module shown in FIG. 7.

The structure and the process for the preparation of the base substrate 2 are now explained in detail with reference to manufacture process diagrams of FIGS. 8 to 16. Referring to FIG. 8, the manufacture process for the base substrate 2 includes a first pattern wiring layer forming process s-1 for forming a first pattern wiring layer 12 and a second pattern wiring layer 13 on front and reverse major surfaces 5a, 5b of the core substrate 5, and for forming plural via-holes 14 therein, a first copper foil bonding process s-2 for bonding the first resin-coated copper foil 8 and the second resin-coated copper foil 9 to the front and reverse major surfaces 5a, 5b of the core substrate 5, and a via-forming process s-3 of forming via-holes 15, 16 in these resin-coated copper foils 8, 9. In the manufacture process of the base substrate 2, a base substrate intermediate product 19 is prepared through the above processes and a second pattern wiring layer forming process s-4 of forming a third pattern wiring layer 17 and a fourth pattern wiring layer 18 on the so bonded resin-coated copper foils 8, 9.

The manufacture process for the base substrate 2 includes a second copper foil bonding process a-5 of bonding a third resin-coated copper foil 10 and a fourth resin-coated copper foil 11 on the base substrate intermediate product 19 for coating the third pattern wiring layer 17 and the fourth pattern wiring layer 18. In the manufacture process for the base substrate 2, the base substrate 2 is prepared through a polishing step s-6 of polishing the third resin-coated copper foil 10 and the fourth resin-coated copper foil 11 to form the high frequency device layer forming surface 3 as the uppermost layer on the side major surface 5a.

The core substrate 5 is comprised of a substrate material of low dielectric constant and low tanδ, that is of superior high frequency characteristics, such as polyphenylethylene (PPE), bis maleido triazine (BT-resin), polytetrafluoroethylene (trade mark: Teflon), polyimide, liquid crystal polymer (LCP), polynorbornene (PNB), ceramics or a mixture of ceramics with an organic substrate. As the core substrate 5, an epoxy-based substrate FR-5, having thermal resistance and resistance to chemicals, in addition to mechanical strength, and which is less costly than the aforementioned substrates, is also used. The core substrate 5, formed by the aforementioned substrate, is less costly than the Si substrate or the glass substrate which is rather expensive due to its characteristic high precision, thereby reducing the materials cost.

Figure 9:
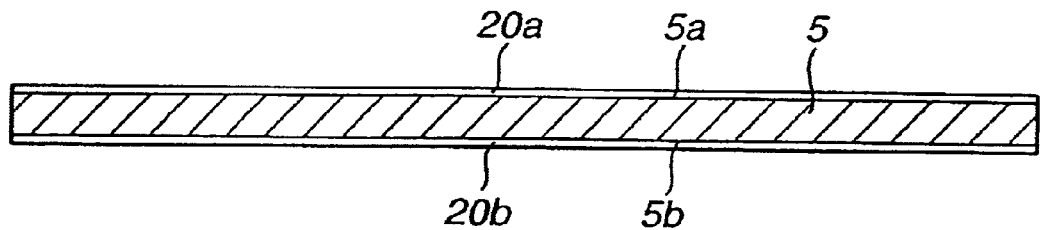
FIG. 9 is a longitudinal cross-sectional view showing a core substrate employed in the high frequency transmission/reception module shown in FIG. 7.
Figure 10:
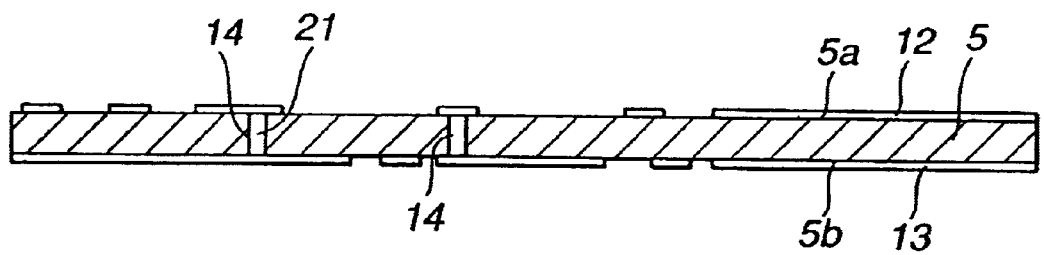
FIG. 10 illustrates a patterning process for a core substrate.

The first and second major surfaces 5a, 5b of the core substrate 5 are lined in their entirety with copper foil layers 20a, 20b, as shown in FIG. 9. The core substrate 5 is subjected to the first pattern wiring layer forming process s-1. The core substrate 5 is subjected to a punching processing by a drill or laser to form via-holes 14 at preset positions. After burying an electrically conductive paste in the via-holes 14 of the core substrate 5, the inner wall surfaces of which are rendered electrically conductive by e.g., plating, a lid is formed by a plating method. The copper foil layers 20a, 20b of the core substrate 5 are subjected to photolithographic processing to form the first pattern wiring layer 12 and the second pattern wiring layer 13 on the first and second major surfaces 5a, 5b, as shown in FIG. 10.

Figure 11:
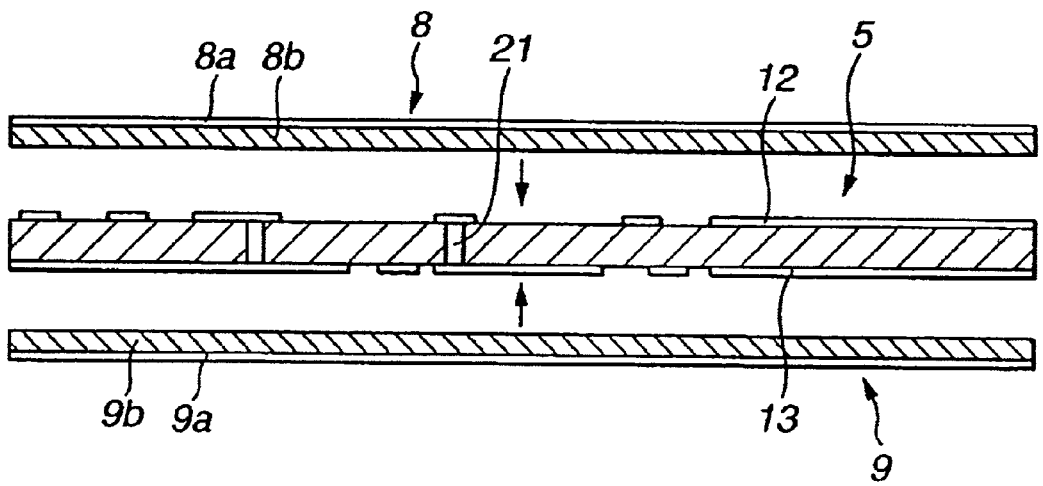
FIG. 11 illustrates a process of bonding a copper wire carrying a first resin and another copper wire carrying a second resin.
Figure 12:
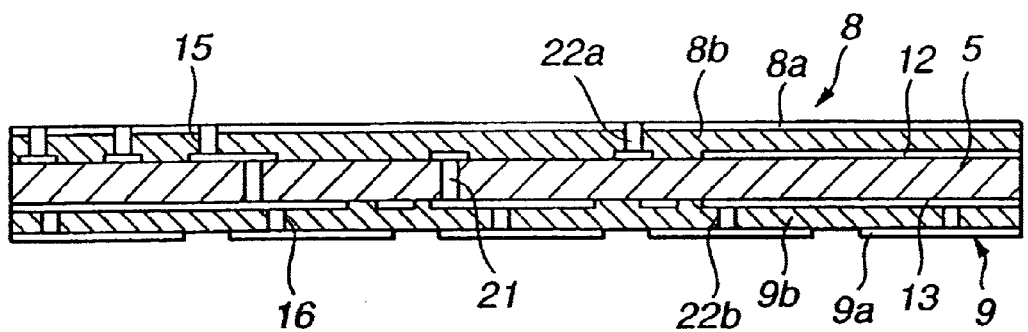
FIG. 12 illustrates a process of forming a via-hole.

The first and second pattern wiring layers 12, 13 then are applied to the core substrate 5 from the above process, by the first copper foil bonding process s-2, to affix the first and second resin-coated copper foils 8, 9 to the first and second major surfaces 5a, 5b, as shown in FIG. 11. As the first and second resin-coated copper foils 8, 9, resin-coated copper foils, obtained on lining resin layers 8b, 9b on one major surfaces of copper foil layers 8a, 9a in their entirety, are used.

The first and second resin-coated copper foils 8, 9 are bonded to the first and second major surfaces 5a, 5b of the core substrate 5, using a bonding resin (pre-preg), with the resin layers 8b, 9b as bonding surfaces. If the resin layers 8b, 9b are formed of thermoplastic resins, the first and second resin-coated copper foils 8, 9 are bonded to the core substrate 5, with the bonding resin being then unnecessary. With the first and second resin-coated copper foils 8, 9 remaining bonded to the core substrate 5, the first and second resin-coated copper foils 8, 9 are subjected to the via-forming process s-3. Thus, the sites thereof in register with the via-holes 14 to be formed are subjected to the photolithographic processing to form via-holes 15, 16. In the via-forming process s-3, the sites of the first and second resin-coated copper foils 8, 9, in which to form via-holes, are subjected to the photolithographic processing followed by wet etching to form openings 22a, 22b in the first and second resin-coated copper foils 8, 9, and laser processing then is carried out with these openings 22a, 22b as masks to form the via-holes 15, 16, with the land of the first pattern wiring layer 12 or the second pattern wiring layer 13 serving as supports.

Figure 13:
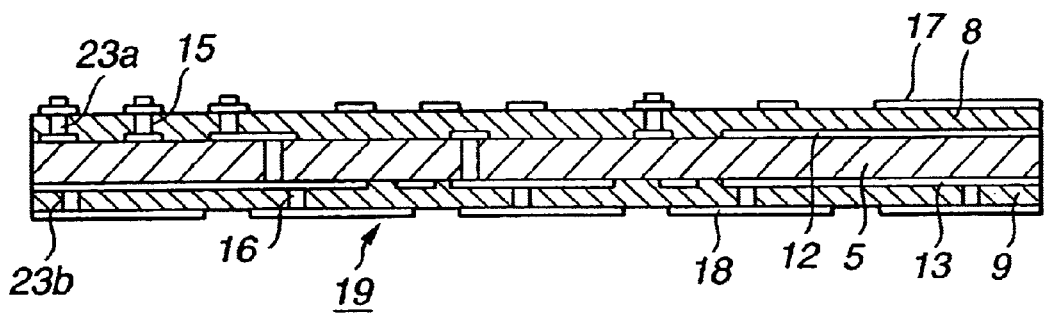
FIG. 13 illustrates a process of forming a first pattern wiring layer and a second pattern wiring layer.

The inner wall surfaces of the via-holes 15, 16 of the first and second resin-coated copper foils 8, 9 are rendered electrically conductive by e.g., via-hole plating. These via-holes 15, 16 are charged with electrically conductive materials 23a, 23b by embedding an electrically conductive paste or a plating method. By the second pattern wiring layer forming process s-4, the copper foil layers 8a, 9a of the first and second resin-coated copper foils 8, 9 are patterned in a preset fashion to form the third pattern wiring layer 17 and the fourth pattern wiring layer 18, as shown in FIG. 13. Similarly to the first pattern wiring layer forming process s-1, the second pattern wiring layer forming process s-4 performs photolithographic processing on the copper foil layers 8a, 9a to form the third pattern wiring layer 17 and the fourth pattern wiring layer 18 on the resin layers 8b, 9b to form the base substrate intermediate product 19.

Figure 14:
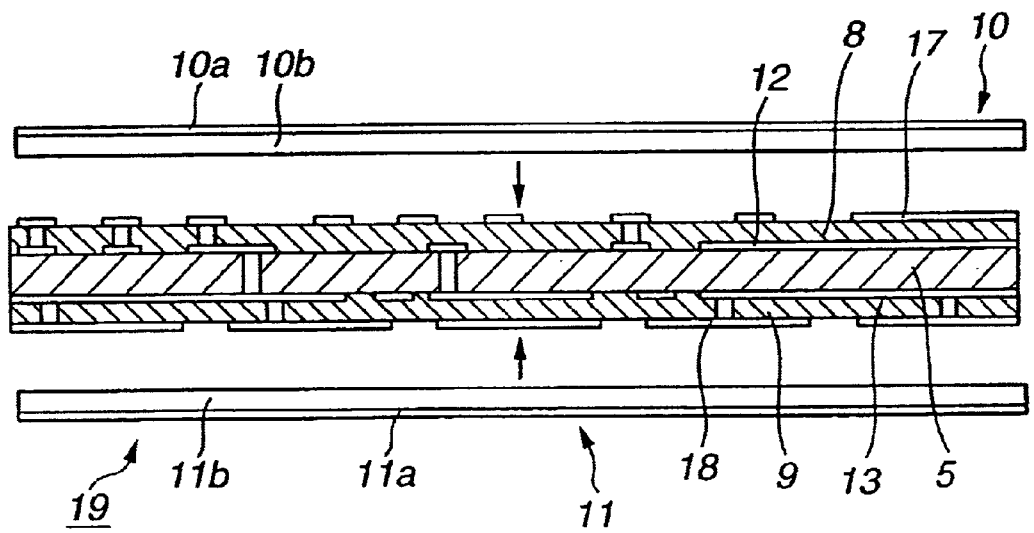
FIG. 14 illustrates a process of bonding a copper wire carrying a third resin and another copper wire carrying a fourth resin.

In the base substrate forming process, the high frequency device layer forming surface 3 exhibiting high planarity is formed on the base substrate intermediate product 19, in order to form the high frequency device layer portion 4, as later explained, on the base substrate intermediate product 19. By a second copper foil bonding process s-5, the base substrate intermediate product 19 is coated with the third pattern wiring layer 17 and the fourth pattern wiring layer 18 as shown in FIG. 14 to bond the third resin-coated copper foil 10 and the fourth resin-coated copper foil 11 to the front and reverse major surfaces 5a, 5b, respectively.

Figure 15:
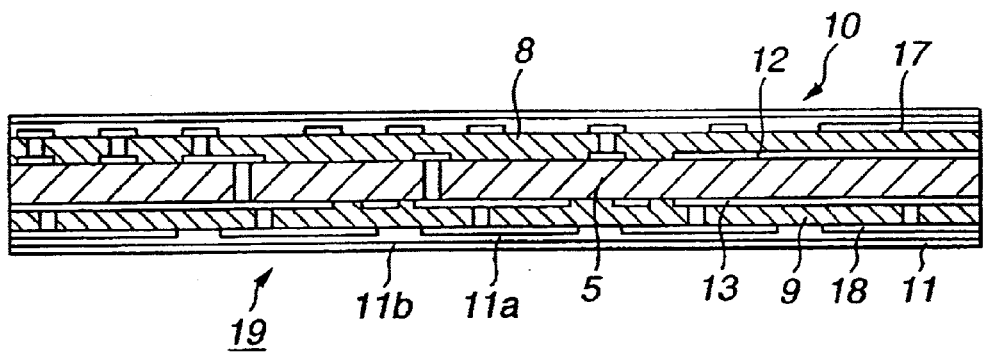
FIG. 15 illustrates a process in which the copper wire carrying the third resin and the other copper wire carrying the fourth resin are bonded together.

Similarly to the aforementioned first and second resin-coated copper foils 8, 9, the third resin-coated copper foil 10 and the fourth resin-coated copper foil 11 are formed by having one entire major surfaces of copper foil layers 10a, 11a lined with resin layers 10b, 10b, respectively. The third resin-coated copper foil 10 fourth resin-coated copper foil 11 are bonded with a prepreg (bond resin) on the front and reverse major surfaces of the base substrate intermediate product 19, with the resin layers 10b, 11b as the bond surfaces, as shown in FIG. 15. If the resin layers 10b, 11b are formed by thermoplastic resins, the third resin-coated copper foil 10 fourth resin-coated copper foil 11 are bonded to the base substrate intermediate product 19, with the bond resin being then unnecessary.

Figure 16:
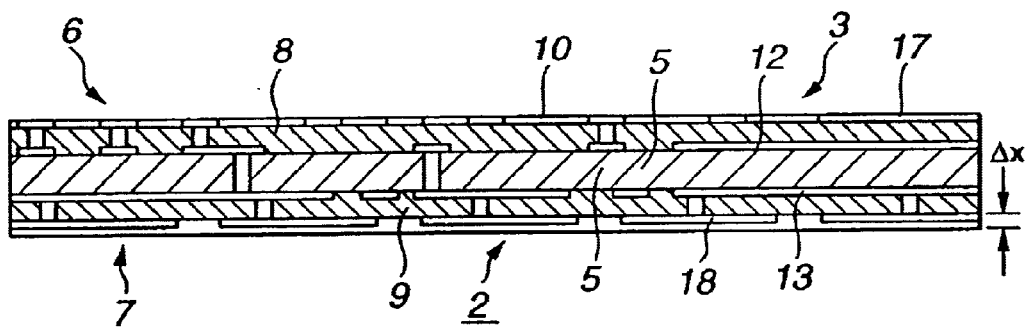
FIG. 16 illustrates a process of polishing the copper wire carrying the third resin and the other copper wire carrying the fourth resin.
Figure 17:
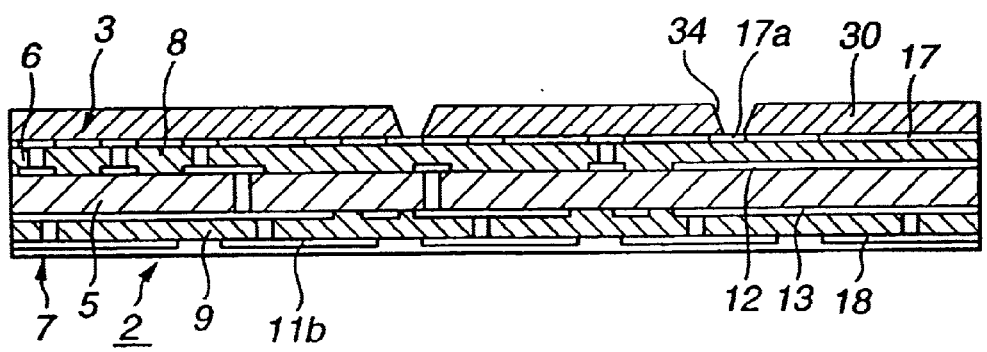
FIG. 17 illustrates a process of forming a process of forming the first resin layer.

The third resin-coated copper foil 10 and the fourth resin-coated copper foil 11, bonded to the base substrate intermediate product 19, are polished by a polishing process s-6. In this polishing process s-6, the entire surfaces of the third and fourth resin-coated copper foil 10, 11 are polished with a grinding liquid mixture composed of, for example, alumina and silica, to polish both sides of the base substrate intermediate product 19 into highly planar surfaces. In the polishing process s-6, the side third resin-coated copper foil 10, in other words, the high frequency device layer forming surface 3, is polished until the third pattern wiring layer 17 is exposed, as shown in FIG. 16. Moreover, in the polishing process s-6, the side fourth resin-coated copper foil 11 is polished so that the resin layer 11b has a preset thickness Δx, without allowing the fourth pattern wiring layer 18 to be exposed.

In the base substrate forming process, a base substrate 2, carrying the high frequency device layer forming surface 3 exhibiting the optimum precision planarity, is formed by the above process steps from the stage of the core substrate 5 through the stage of the base substrate intermediate product 19. In the base substrate forming process, the process of forming the base substrate intermediate product 19 similar to the manufacture process for the conventional multi-layered substrate is used to enable the manufacture process for the preparation of the multi-layered substrate may directly be applied, as high mass-producibility is kept. It should be noted that the manufacture process for the base substrate is not limited to the above process such that a variety of manufacture processes for the multi-layered substrate may be used.

On the base substrate 2, the second pattern wiring layer 13 is formed by the second resin-coated copper foil 9 bonded to the second major surface 5b of the core substrate 5, as described above. In the base substrate 2, this second pattern wiring layer 13 is not exposed by limiting the polishing amounts of the resin layer 11b of the fourth resin-coated copper foil 11. By this configuration, the second pattern wiring layer 13 of the base substrate 2 is protected against chemicals, mechanical load or thermal load by the resin layer 11b (dielectric layer), which is left over, in the high frequency device layer forming processing, which will be explained subsequently. After forming the high frequency device layer portion 4, the resin layer 11b is removed by cutting to expose the second pattern wiring layer 13 to form an input/output terminal 24.

On the base substrate 2, prepared as described above, the high frequency device layer portion 4 is layered on the high frequency device layer forming surface 3, through a high frequency device layer forming process, which will be explained subsequently. The high frequency device layer portion 4 is comprised of the high frequency device layer forming surface 3 of the planarized base substrate 2 on which are formed a device forming layer portion 28 and a wiring layer portion 29. The device forming layer portion 28 has enclosed therein passive elements, such as an inductor 25, a capacitor 26 or a resistor 27, produced using a thin film forming technique or a thick film forming technique. The high frequency device layer portion 4, on the wiring layer portion 29 of which a high frequency IC 90 or a chip component 91 is mounted, is coated in its entirety with a shield cover 92.

Meanwhile, in the base substrate forming process, the fourth resin-coated copper foil 11 bonded to the base substrate 5 via second resin-coated copper foil 9 polishes the copper foil layer 11a. In the base substrate forming process, the respective components, bonded together, are pressed into one unit by a press. In the base substrate forming process, the metal press surface has high affinity with respect to the fourth resin-coated copper foil 11 to assure high precision press working. Thus, in the fourth resin-coated copper foil 11, in which the copper foil does not form the wiring layer, other resin-coated metal foils, other than copper foils, may be used.

The structure and the manufacture process for the high frequency device layer portion 4 is explained in detail by referring to manufacture process diagrams of FIGS. 8 and 17 through 23. The manufacture process for the high frequency device layer portion 4 includes a first insulating layer forming step s-7 of forming a first insulating layer 30 on the planarized high frequency device layer forming surface 3 of the base substrate 2, prepared as described above, an underlayer processing step s-8 of applying underlayer processing for forming the device forming layer portion 28 on the first insulating layer 30 and a passive element forming step s-9 of forming each passive element in the device forming layer portion 28. The manufacture process for the high frequency device layer portion 4 prepares the high frequency module device 1 through a second insulating layer forming step s-10 of forming a second insulating layer 31 for coating the device forming layer portion 28 and for forming the wiring layer portion 29, a wiring layer forming step s-11 of forming a preset pattern 32 and passive elements on the wiring layer portion 29 and a resist layer forming step s-12 of forming resist layers 33a, 33b coating the front and reverse major surfaces.

In the first insulating layer forming step s-7, an insulating dielectric material is fed to the high frequency device layer forming surface 3 of the base substrate 2 to form the first insulating layer 30. As the insulating dielectric material, such a material which is low in dielectric constant and in tanδ, that is such a material which is superior in high frequency characteristics, thermal resistance and in resistance against chemicals, is used. As the insulating dielectric material, benzocyclobutene (BCB), polyimide, polynorbornene (PNB), liquid crystal polymers (LCP), epoxy resins or acrylic resins, may be used. As the film forming method, such a method which is able to maintain coating uniformity or thickness controllability, such as a spin coating method, a roll coating method or a dip coating method, may be used.

In the first insulating layer forming step s-7, a large number of via-holes 34 are formed in the first insulating layer 30 formed on the base substrate 2, as shown in FIG. 7. The respective via-holes 34 are formed in register with the preset lands 17a of the third pattern wiring layer 17 exposed to the high frequency device layer forming surface 3 to expose the lands 17a to outside. If the photosensitive resin is used as the insulating dielectric material, a mask formed by preset patterning is placed on the first insulating layer 30 and formed by the photolithographic method. The via-holes 34 may be formed by any other suitable methods.

In the underlayer processing step s-8, a wiring layer 35, comprised of a nickel layer and a copper layer, is formed on the entire surface of the first insulating layer 30, inclusive of the via-holes 34, such as with a sputtering method. The wiring layer 35 is formed so that the thicknesses of the nickel layer and a copper layer will each be 50 to 500 nm or thereabouts. In the underlayer processing step s-8, the wiring layer 35 is removed by etching using a liquid etchant composed of a liquid mixture of nitric acid, sulfuric acid and acetic acid, as the resister forming site of the wiring layer 35 is masked with the resist.

Figure 18:
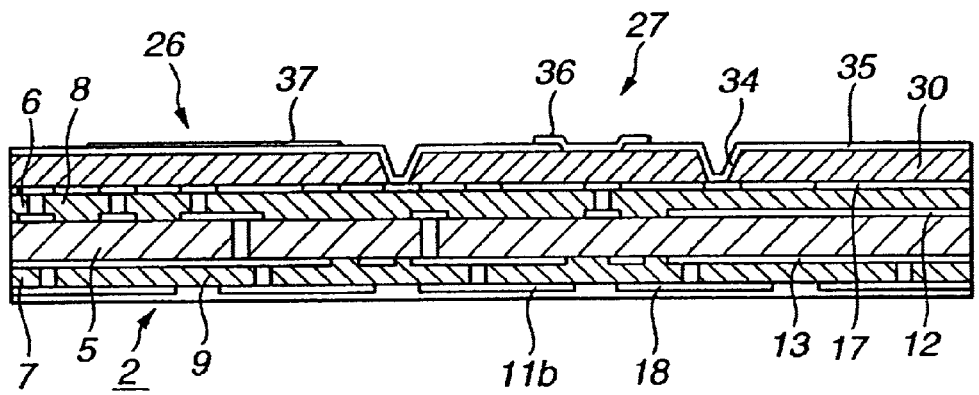
FIG. 18 illustrates a process of forming a wiring layer.

The wiring layer 35 is subjected to the passive element forming step s-9 to form a resistor 27 and a capacitor 28. In the removed site of the wiring layer 35 is formed a tantalum nitride layer 36, by a lift-off method, as shown in FIG. 18. This tantalum nitride layer 36 is formed only in the site of the wiring layer 35n register with the resister 27 by sputtering tantalum nitride (TaN) on the entire resist-processed surface of the wiring layer 35 and by subsequently removing tantalum nitride of the resist layer portion.

On a site of the wiring layer 35 in which to form the capacitor 26, there is also formed a tantalum nitride layer 37, as shown in FIG. 18. As the entire surface of the wiring layer 35 excluding the capacitor forming site is coated with a resist, an electrical field is applied to the wiring layer 35 so that tantalum nitride becomes an anode in an electrolytic solution such as ammonium borate, by way of so-called anodic oxidation. This anodic oxidation is carried out by applying an electrical field on the order of 100V and 30 minutes to oxidize the tantalum nitride layer 37 to form a tantalum oxide ($TaO_2$) layer 38.

Figure 19:
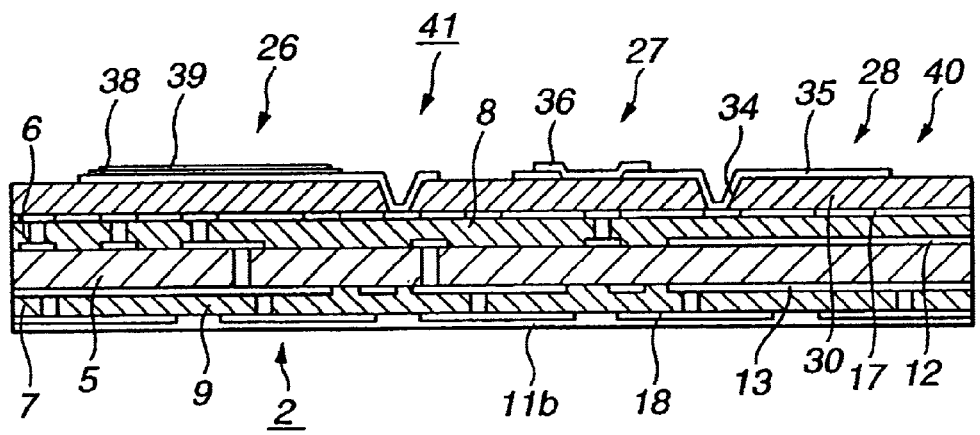
FIG. 19 illustrates a process of forming a passive elements.

The wiring layer 35 is subjected to resist patterning by photolithographic processing so that only the necessary wiring pattern will be left. After removing the resist the tantalum oxide layer 38 is masked, and an upper electrode 39 composed of the nickel and copper layers is formed by, for example, a lift-off method. In the high frequency device layer forming process, a high frequency transmission/reception module substrate intermediate product 41, comprised of a first device forming layer 40 on the base substrate 2 shown in FIG. 19, is prepared by the above process.

Figure 20:
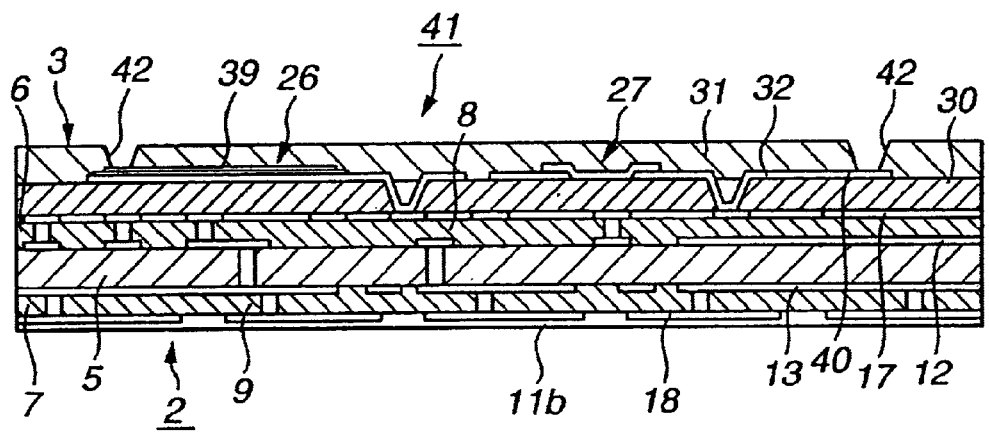
FIG. 20 illustrates a process of forming the second resin layer.

In the high frequency device layer forming process, the second insulating layer 31 is formed by the second insulating layer forming step s-10 on the high frequency transmission/reception module substrate intermediate product 41, prepared by the above process, as shown in FIG. 20. In the second insulating layer forming step s-10, the second insulating layer 31 is formed by a method similar to that used for preparing the first insulating layer 30, while plural via-holes 42 are formed in the second insulating layer 31 for exposing the preset pattern formed in the wiring layer 35 or the upper electrode 39 of the capacitor 26 to outside.

Figure 21:
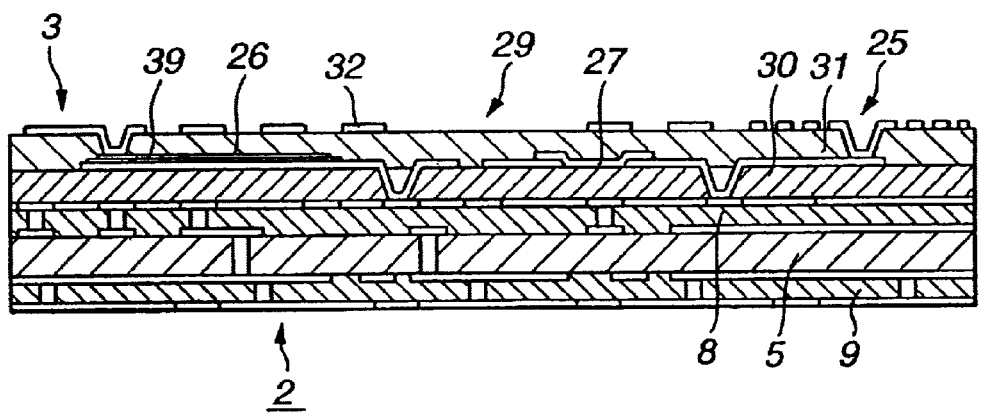
FIG. 21 illustrates a process of forming the wiring layer.

In the high frequency device layer forming process, a pattern wiring 32 is formed on the second insulating layer 31 by the wiring layer forming step s-11. In more detail, in the wiring layer forming step s-11, a sputtering layer composed of a nickel layer and a copper layer is formed by sputtering on the second insulating layer 31 and subjected to a photolithographic processing by way of performing preset patterning. In the wiring layer forming step s-11, the sputtering layer is subjected to selective copper plating by electrical field plating to form a copper plating layer having a thickness approximately several 11m. The resist for plating then is removed and the sputtering layer is etched in its entirety to form the wiring layer portion 29 as shown in FIG. 21.

An inductor 25 is formed at this time in an area of the wiring layer portion 29. The serial resistance value of the inductor 25 is then at issue. However, the inductor 29 may be formed to a sufficient thickness by employing a thick film forming technique of applying electrolytic plating to the sputtering layer, as described above, thereby minimizing the lowering in the loss.

In the high frequency device layer forming process, the high frequency device layer portion 4 is formed on the base substrate 2 by the above process steps, whereby the resin layer 11b, used to protect the second pattern wiring layer 13 from chemicals, mechanical load or the thermal load, is unnecessary. In the high frequency device layer forming process, the resin layer 11b is subjected to polishing to expose the second pattern wiring layer 13.

Figure 22:
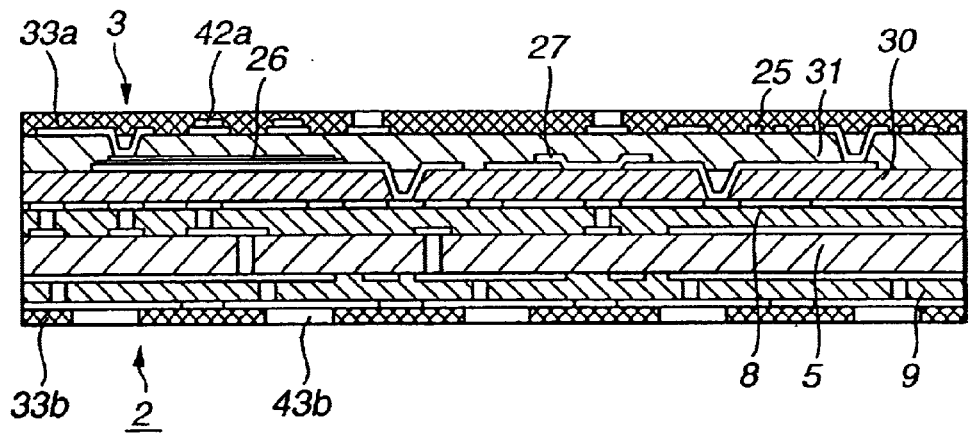
FIG. 22 illustrates a process of forming a resist layer.
Figure 23:
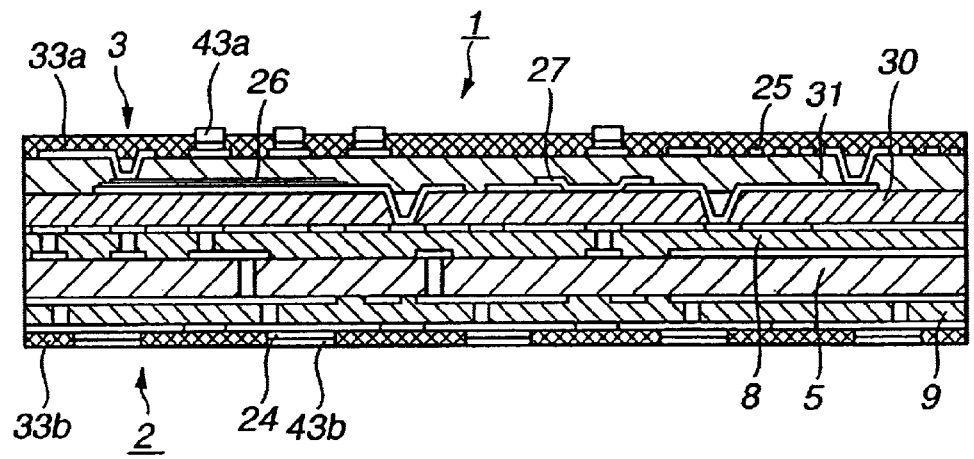
FIG. 23 is a longitudinal cross-sectional view of a high frequency module device.

In the high frequency device layer forming process, permanent resist layers 33a, 33b are coated on the entire surface of the high frequency device layer portion 4 and on the second pattern wiring layer 13, respectively, the by resist layer forming step s-12. In the high frequency device layer forming process, these resist layers 33 are subjected to photolithographic processing through a mask pattern to form openings 42a, 42b at preset sites, as shown in FIG. 22. In the high frequency device layer forming process, these openings 42a, 42b are subjected to electroless nickel plating/copper plating to form electrode terminals 43a, 43b to prepare the high frequency module device 1 shown in FIG. 23.

In the high frequency module device 1, the electrode terminal 43a, provided on the high frequency device layer portion 4, and carrying the high frequency IC 90 or a chip component 91, forms a connection terminal. In the high frequency module device 1, the electrode terminal 43b, provided on the second wiring pattern layer 13 of the base substrate 2, forms a connection terminal and an input/output terminal 24 in loading the device on e.g., the motherboard 99. The high frequency IC 90 is mounted by e.g., a flip chip method through a solder bump 94.

In the above-described high frequency module device 1, the process of bonding the first to fourth resin coated copper foils 8 to 11 to the first major surface 5a and the second major surface 5b of the core substrate 5, comprised of a double-sided substrate, to form the four layer base substrate 2. Of course, the present invention is not limited to this manufacture process for the base substrate 2. In a base substrate manufacture process, shown as a second embodiment in FIGS. 24A–24F, a base substrate 50 similar to the base substrate 2 described above is prepared using two double-sided substrates 51a, 51b. Since the base substrate manufacture process is similar as to respective steps to the manufacture process for the base substrate 2 described above, it is not explained here specifically.

Figure 24A:
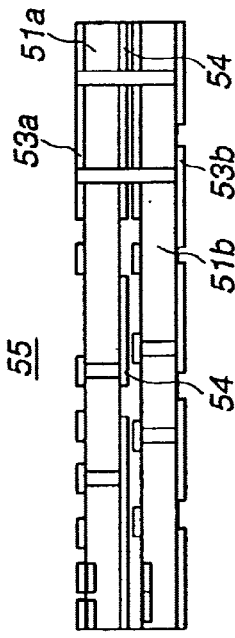
Figure 24B:
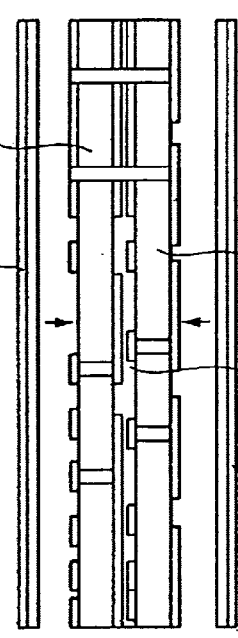
Figure 24C:
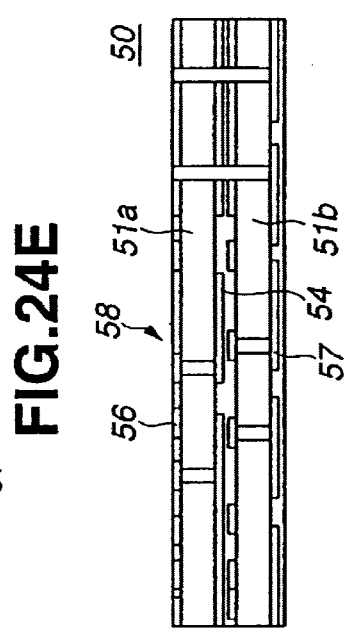

In the base substrate manufacture process, the electrically conductive portions 52a, 52b on the front and reverse major surfaces 5a, 5b of the double-sided substrate 51 shown in FIG. 24A is subjected to photolithographic processing, by way of preset patterning, to form preset circuit patterns 53a, 53b by etching, as shown in FIG. 24B. In the base substrate forming process, the two double-sided substrates 51a, 51b are bonded together, with e.g., an intermediate resin material 54 in-between, as shown in FIG. 24C. In the base substrate forming process, the circuit patterns 53a, 53b of the double-sided substrates 51a, 51b are interconnected through via-holes, as shown in FIG. 24D, to form a base substrate intermediate product 55.

Figure 24E:
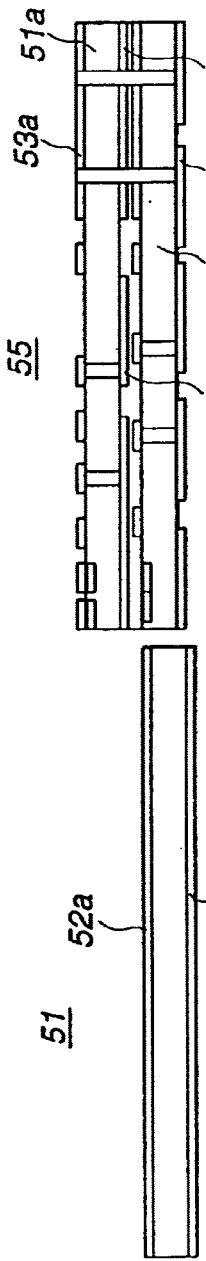
Figure 24E:
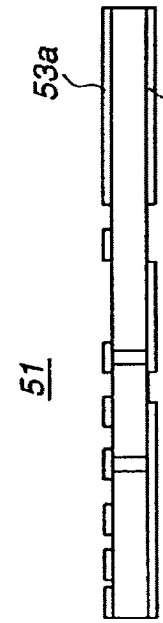
Figure 24F:
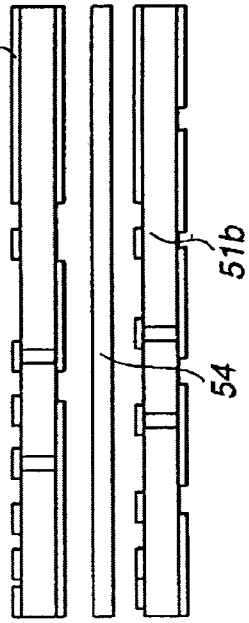

In the base substrate forming process, a first resin-coated copper foil 56 and a second resin-coated copper foil 57 are bonded by heat press on the front and reverse major surfaces of the base substrate intermediate product 55, as shown in FIG. 24E. In the base substrate forming process, as shown in FIG. 24F, the first resin-coated copper foil 56 and the second resin-coated copper foil 57 are subjected to polishing. In the base substrate forming process, the first resin-coated copper foil 56 is subjected to polishing so that the circuit pattern 53a will be exposed to outside, insofar as the first double-sided substrate 51a is concerned, to form a highly planarized high frequency device layer forming surface 58. In the base substrate forming process, the second resin-coated copper foil 57 is subjected to polishing so that the circuit pattern 53b will not be exposed to outside, insofar as the first double-sided substrate 51b is concerned. In the base substrate forming process, the base substrate 50 is prepared through the above processing steps, as shown in FIG. 24G.

Figure 25C:
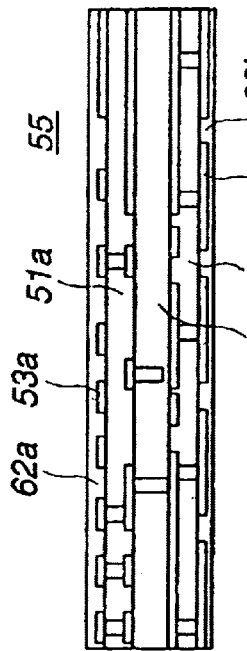
FIGS. 25A–25D illustrate a process of producing abase substrate by a dip coating method.
Figure 25D:
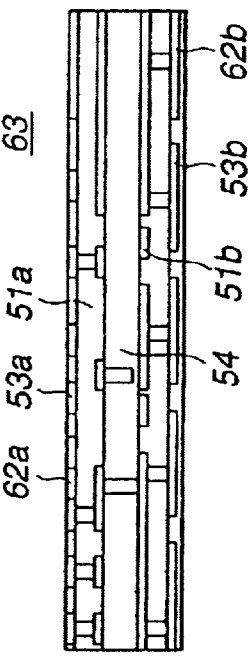
Figure 25A:
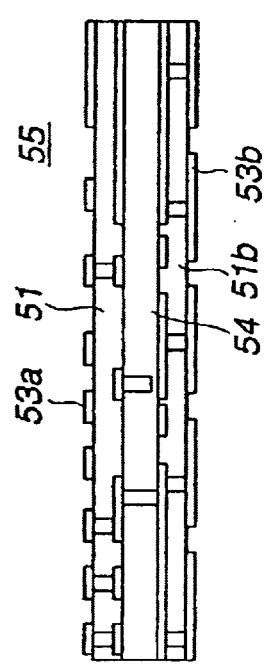
Figure 25B:
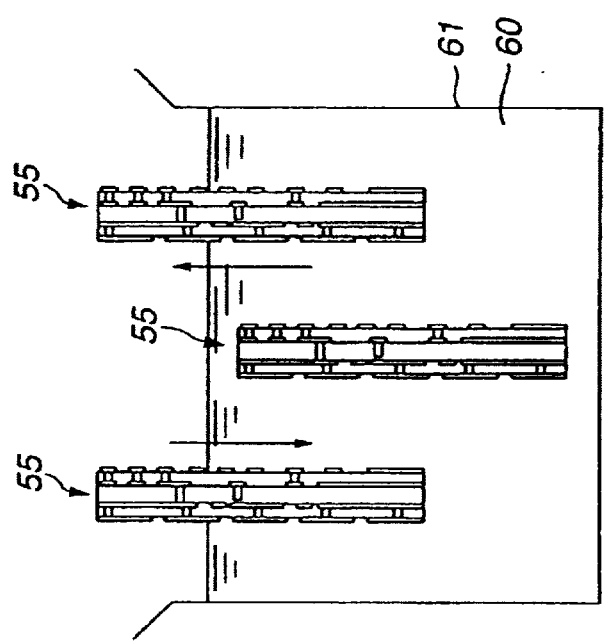

The base substrate forming process, shown in FIGS. 25A–25D as a third embodiment, includes a process of coating a liquid resin material 60 by a dip coating method on the base substrate intermediate product 55, shown in FIG. 25A, produced by e.g., the above-described second embodiment. That is, in the base substrate forming process, a liquid resin material 60, dissolved with a suitable solvent, is accumulated in a dip tank 61, in which the base substrate intermediate product 55 is immersed, as shown in FIG. 25B.

In the base substrate forming process, the base substrate intermediate product 55 is taken out from the dip tank 61 after a proper dipping time at a proper lift speed. In the base substrate forming process, resin layers 62a, 62b of the liquid resin material 60 are formed simultaneously on the front and reverse major surfaces of the base substrate intermediate product 55, as shown in FIG. 25C. In the base substrate forming process, the base substrate intermediate product 55, now carrying the resin layers 62, is subjected to baking, as the base substrate intermediate product 55 is kept in a horizontal position, to vaporize excess organic components off. In the base substrate forming process, the base substrate intermediate product 55 is subjected to the aforementioned polishing, whereby the resin layers 62a, 62b are polished in preset amounts to produce a base substrate 63 shown in FIG. 25D.

In the base substrate forming process, the concentration of the liquid resin material 60, dip time or the lift speed is controlled to realize the film thickness accuracy of the resin layers 62. Meanwhile, the resin layers 62 may be planarized by dry etching methods, such as reactive ion etching (RIE) or plasma etching (PE).

Meanwhile, in the high frequency module device 1, a high frequency IC 90 or a chip component 91 is loaded by a flip chip method on the surface of the high frequency device layer forming surface 3, with the entire device being covered by the shield cover 92, as shown in FIG. 7. So, with the high frequency module device 1, heat evolved from the high frequency IC 90 or the chip component 91 is accumulated in the shield cover 92. Therefore, it is desirable to provide a heat radiating structure.

Figure 26:
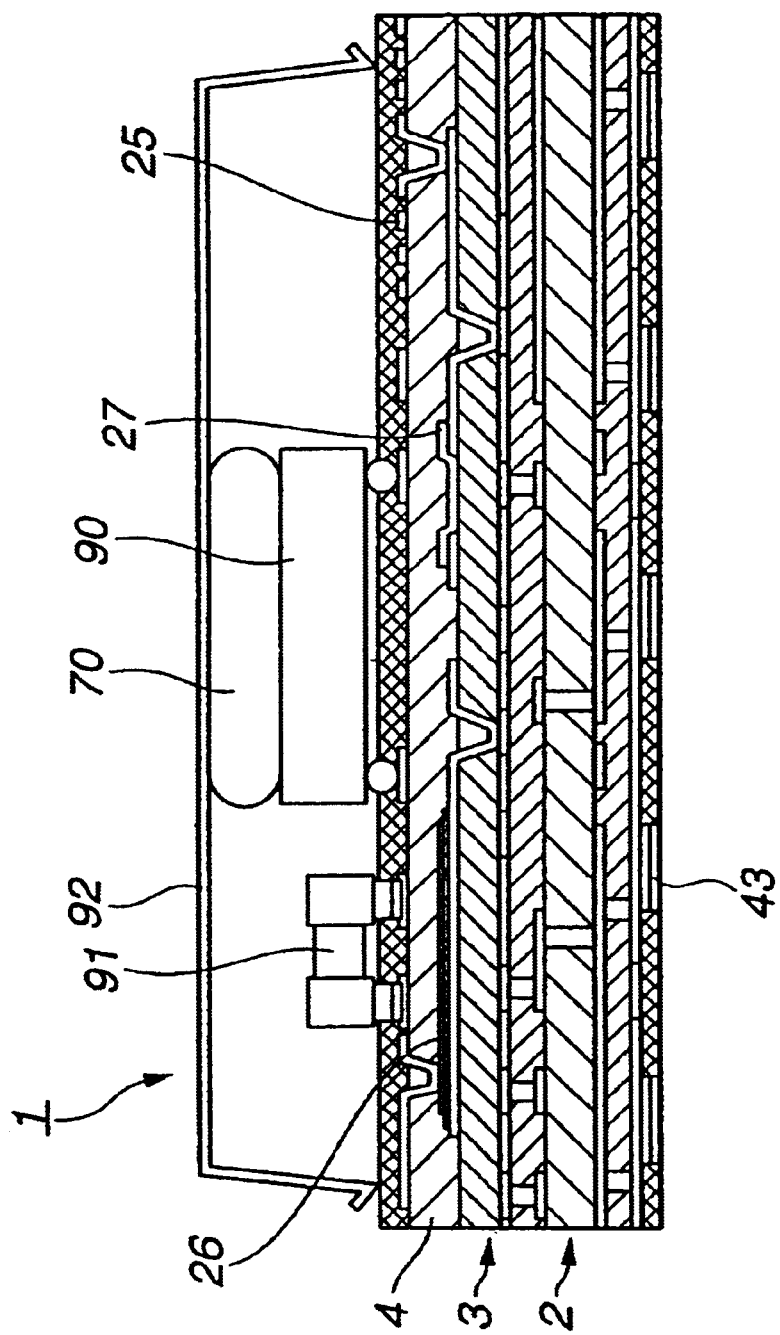
FIG. 26 is a longitudinal cross-sectional view of a high frequency module device having a heat radiating structure.

In the high frequency module device 1, a heat conductive resin material 70 is charged into a space defined between the upper surface of the high frequency IC 90 having a large heat generating volume and the inner surface of the shield cover 92, as shown in FIG. 26. In the high frequency module device 1, the heat evolved from the high frequency IC 90 is transmitted through the heat conductive resin material 70 to the shield cover 92 and then radiated to outside. Meanwhile, since the high frequency IC 90 of a larger size is held by the heat conductive resin material 70 and by the shield cover 92, the high frequency module device 1 is also improved in mechanical strength.

Figure 27:
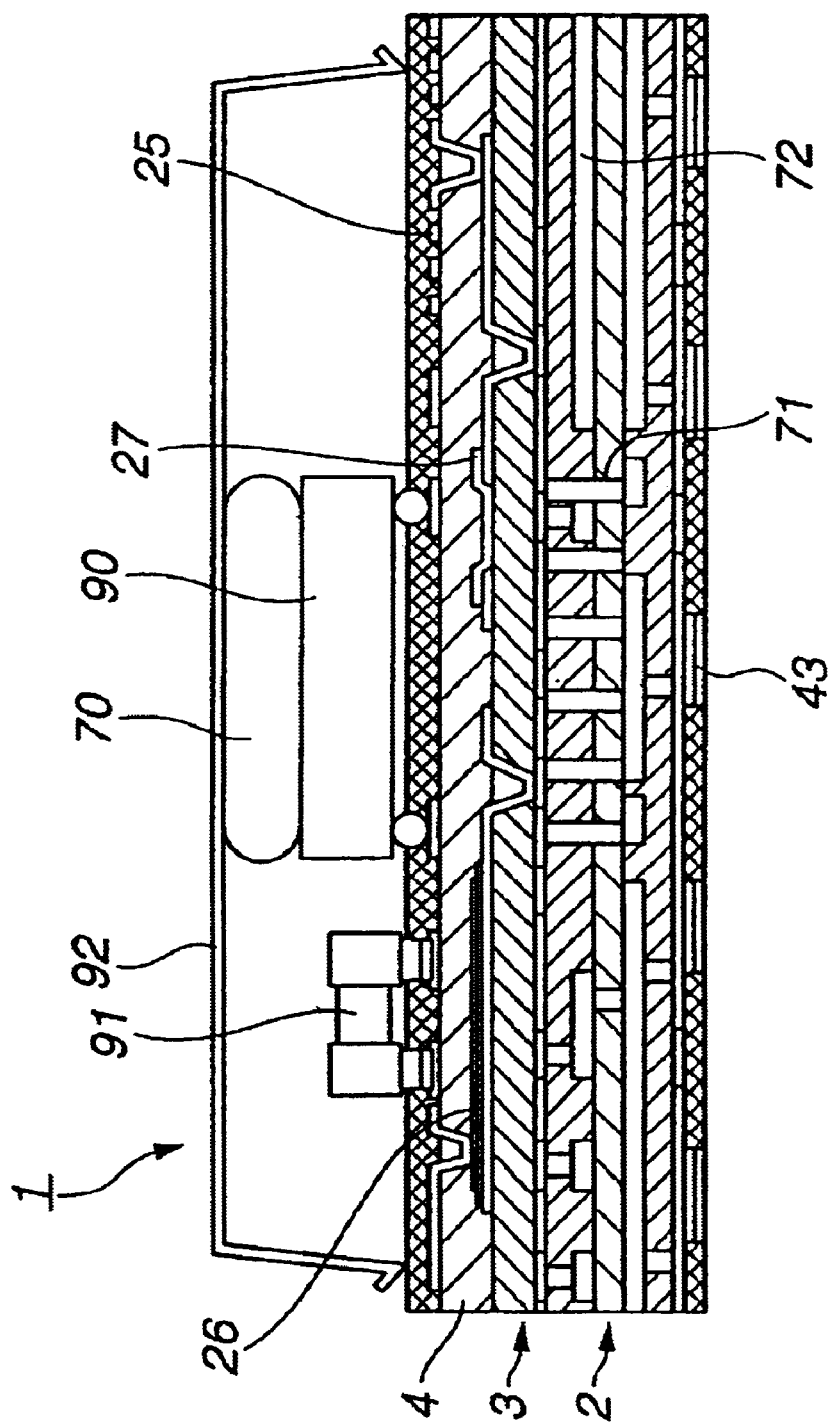
FIG. 27 is a longitudinal cross-sectional view of a high frequency module device having another heat radiating structure.

In the high frequency module device 1, a large number of cooling via-holes 71, for establishing communication between the base substrate 2 and the high frequency device layer portion 4, may be provided in register with the loading area of the high frequency IC 90, as shown in FIG. 27. These cooling via-holes 71 are formed at the time of forming the interconnecting via-holes in the base substrate 2 or in the high frequency device layer portion 4 by a similar process. In the high frequency module device 1, the heat from the high frequency IC 90 is transmitted through the cooling via-holes 71 to the bottom surface of the base substrate 2 and then radiated to outside. If the high frequency module device 1 is used simultaneously as the heat-radiating electrically conductive resin material 70, described above as shown in FIG. 27, heat radiation occurs from above and below to improve the heat radiation.

In the high frequency module device 1, a copper foil portion 72, formed in the base substrate 5, may be increased in thickness to e.g., 50 nm, as shown in FIG. 27. In the high frequency module device 1, heat radiation may occur from the base substrate 5 by connecting the cooling via-holes 71 to the copper foil portion 72.

Figure 28:
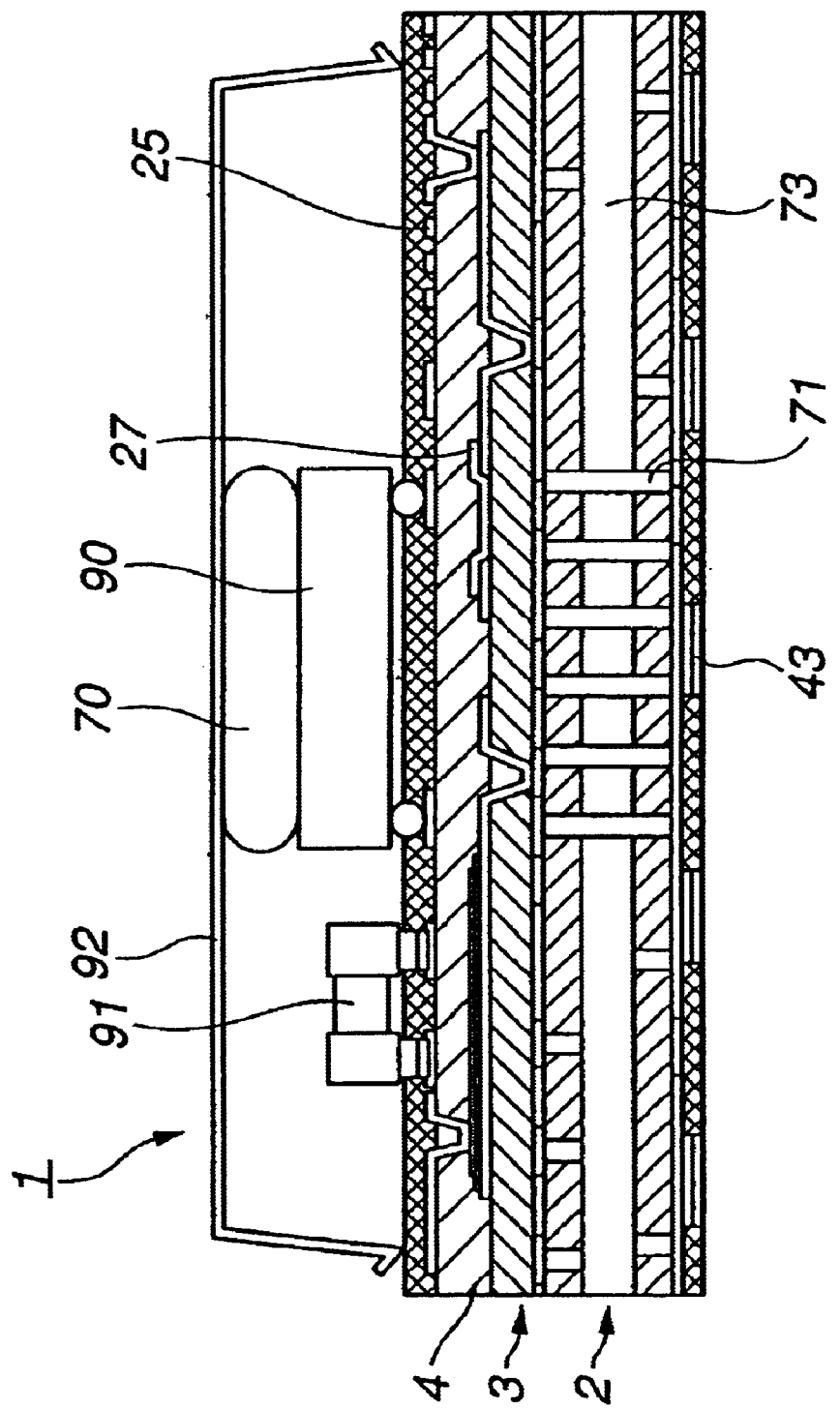
FIG. 28 is a longitudinal cross-sectional view of a high frequency module device having yet another heat radiating structure.

In the high frequency module device 1, a core substrate 73, forming the base substrate 2, may be formed of an electrically conductive material, as shown in FIG. 28. The core substrate 72 may be formed by a metal core of high electrically conductivity, such as copper or 42-alloy, to interconnect the numerous cooling via-holes 71. In the high frequency module device 1, heat radiation occurs not only from the heat-radiating electrically conductive resin material 70 and from the cooling via-holes 71, but from the core substrate 73, thus assuring efficient heat radiation to improve the operational reliability.

What is claimed is:

1. A high frequency module device comprising:
    a base substrate including a core substrate formed of an organic material having thermal resistance and high frequency characteristics, a pattern wiring layer formed on a first major surface of said core substrate in which an uppermost layer of said pattern wiring layer is planarized to form a high frequency device layer forming surface, and a number of copper foil layers each affixed to a resin layer to form a resin-coated copper foil layer located adjacent to said core substrate; and
    a high frequency device layer portion formed on said high frequency device layer forming surface of said base substrate;
    wherein passive elements are formed in the high frequency device layer portion by a thin film forming technique or by a thick film forming technique, said passive elements including resistors, capacitors and pattern wiring portions supplied with power or signals from said base substrate through a dielectric insulating layer;
    wherein said pattern wiring layer is formed on the dielectric insulating layer formed as the uppermost layer of said high frequency device layer, wherein a coating layer is formed by exposing a preset land of said pattern wiring and wherein at least one high frequency IC device directly connected to said land is directly loaded on said coating layer.

2. The high frequency module device according to claim 1 wherein said core substrate is a double-sided substrate or an epoxy-based double-sided substrate formed of one or more materials selected from the group consisting of polyphenyl ethylene, bismaleidotriazine, polyimide, liquid crystal polymer, polynorbornene, ceramics and mixtures of ceramics and organic materials.

3. The high frequency module device according to claim 1 wherein said core substrate has a patterned input/output terminals on a second major surface of said core substrate facing said high frequency device layer forming surface so as to serve as a power source or as a signal input/output surface, and wherein said second major surface being directly mounted on a motherboard through said input/output terminals.

4. The high frequency module device according to claim 1 wherein said dielectric insulating layer includes multiple layers on said high frequency device layer forming surface of said base substrate formed from an organic material, selected from a group including benzocyclobutene, polyimide, polynorbornene or liquid crystal polymer, epoxy-based resin or acrylic resin exhibiting high frequency characteristics, thermal resistance, resistance against chemicals, uniform coating characteristics and thickness controlling characteristics.

5. The high frequency module device according to claim 1 wherein a shield cover covering an entire surface including said high frequency IC device is mounted on said high frequency device layer.

6. The high frequency module device according to claim 5 wherein a resin material exhibiting heat conduction properties is charged into a space between said high frequency IC device and an inner surface of said shield cover.

7. The high frequency module device according to claim 5 wherein a large number of heat-radiating cooling via-holes are formed in said base substrate in register with a loading area for said high frequency IC device.

8. The high frequency module device according to claim 7 wherein a large number of heat-radiating via-holes communicating with respective heat-radiating via-holes of said high frequency device layer are formed in said base substrate and wherein a heat radiating plate is formed in said core substrate.

9. The high frequency module device according to claim 7 wherein said heat-radiating via-holes are connected to a portion of the pattern wiring layer formed on said first major surface of said core substrate, and wherein said pattern wiring layer has a thickness not less than 50 $\mu$m.

* * * * *